US007948318B2

United States Patent
Hongo et al.

(10) Patent No.: US 7,948,318 B2
(45) Date of Patent: May 24, 2011

(54) AMPLIFYING CIRCUIT, AC SIGNAL AMPLIFYING CIRCUIT AND INPUT BIAS ADJUSTING METHOD

(75) Inventors: Hironobu Hongo, Kawasaki (JP); Katsutoshi Ishidoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/752,402

(22) Filed: Apr. 1, 2010

(65) Prior Publication Data

US 2010/0264990 A1  Oct. 21, 2010

(30) Foreign Application Priority Data

Apr. 20, 2009  (JP) ................. 2009-102045

(51) Int. Cl.
  *H03G 3/10*  (2006.01)
(52) U.S. Cl. .................. 330/285; 330/296; 330/136
(58) Field of Classification Search .................. 330/285, 330/296, 136
See application file for complete search history.

(56) References Cited

U.S. PATENT DOCUMENTS

| 6,198,315 | B1 * | 3/2001 | Nakano ........................ 327/110 |
| 6,507,227 | B2 * | 1/2003 | Genova et al. ................ 327/109 |
| 7,098,740 | B2 * | 8/2006 | Kondo et al. .................. 330/295 |
| 7,221,102 | B2 * | 5/2007 | Kotani et al. .................. 315/248 |
| 7,804,310 | B2 * | 9/2010 | Amada .......................... 324/713 |
| 7,873,335 | B2 * | 1/2011 | Hug et al. .................. 455/127.1 |

FOREIGN PATENT DOCUMENTS

| JP | 3-249810 | 11/1991 |
| JP | 2004-274316 | 9/2004 |

* cited by examiner

*Primary Examiner* — Patricia Nguyen
(74) *Attorney, Agent, or Firm* — Katten Muchin Rosenman LLP

(57) ABSTRACT

An amplifying circuit includes: an amplifying unit which amplifies an input signal and applies the amplified signal to a designated load; a current detection unit which detects a load current that flows into the designated load upon application of the amplified signal; an estimating unit which calculates, based on the voltage level of the input signal, an estimated value of the load current to be supplied to the load; and an adjusting unit which adjusts an input bias, to be applied to the amplifying unit, in such a manner so as to reduce a difference value representing a difference between the estimated value and the load current detected by the current detection unit.

8 Claims, 11 Drawing Sheets

AMPLIFYING CIRCUIT, AC SIGNAL AMPLIFYING CIRCUIT AND INPUT BIAS ADJUSTING METHOD

CROSS-REFERENCE TO RELATED APPLICATIONS

This application is based upon and claims the benefit of priority of the prior Japanese Patent Application No. 2009-102045, filed on Apr. 20, 2009, the entire contents of which are incorporated herein by reference.

FIELD

The embodiments discussed herein are related to an amplifying circuit for amplifying an input signal.

BACKGROUND

FIG. 1 is an explanatory diagram illustrating a configuration example of an amplifying circuit. The amplifying circuit includes an n-channel field-effect transistor (FET) 101 for amplifying an input signal supplied from a signal source 100. The input signal from the signal source 100 is first passed through a resistor R10 and then fed into a capacitor C10 where the DC component of the input signal is removed. The input signal whose DC component is thus removed, and then summed with a gate bias voltage, and the resulting signal is applied to the gate terminal of the FET 101. The gate bias voltage is supplied from a power supply line that supplies predetermined voltage $V_g$ via a resistor R11, which is grounded via a capacitor C11.

The drain terminal of the FET 101 is coupled via an inductor L10 to a power supply line that supplies voltage $V_d$. This power supply line is grounded via a capacitor C12. The amplified signal obtained by amplifying the input signal by the FET 101 is output from its drain terminal and applied via a DC component removing capacitor C13 to a load 102.

The gate voltage biasing method of the FET 101 includes a class of operation intended for power conservation, which is described as class B operation, class C operation, etc., according to the magnitude of the voltage applied to the gate. The biasing method further includes a class of operation described as class AB operation in which bias current flows even during a period when there is no input signal in order to avoid signal waveform distortion that occurs near the pinch-off voltage, though this operation increases power consumption compared with the above two classes.

There is proposed a class AB operating transistor power amplifying circuit for amplifying an amplitude-modulated wave, which includes a detector for detecting a portion of an input signal, an impedance conversion circuit for performing impedance conversion on the output of the detector, a time constant circuit for integrating the output of the impedance conversion circuit, and an amplifying circuit for amplifying the output of the time constant circuit. The base bias of this transistor power amplifying circuit is controlled by the output of the amplifying circuit.

There is also proposed a power amplifier wherein when amplifying an input power signal by a class B or class AB amplifier, the gate voltage can be set to the operating point of FET without an operator having to make an adjustment for setting the gate voltage to the operating point. This power amplifier includes a first field-effect transistor which amplifies the input power signal applied to its gate terminal and outputs the amplified signal at its drain terminal, a bias setting circuit which applies a predetermined voltage to the gate terminal while maintaining a first drain current applied to the drain terminal at a predetermined value, a detector circuit which produces a voltage signal proportional to the magnitude of the input power signal and sends it out from an output terminal, and a current supply circuit which supplies the drain terminal with a second drain current corresponding to the voltage signal received from the detector circuit.

Related art is disclosed in Japanese Laid-open Patent Publication No. H03-249810 and Japanese Laid-open Patent Publication No. 2004-274316.

SUMMARY

According to one embodiment, there is provided an amplifying circuit for amplifying a signal having a waveform that alternates repeatedly between a first section where a signal value varies within a variation range limited by at least one of upper and lower limit values and a second section that is a section other than the first section, including: an amplifying unit which amplifies the input signal and applies the amplified signal to a designated load; a current detection unit which detects a load current that flows into the designated load upon application of the amplified signal; an estimating unit which calculates, based on the voltage level of the input signal, an estimated value of the load current to be supplied to the load; and an adjusting unit which adjusts an input bias, to be applied to the amplifying unit, in such a manner so as to reduce a difference value representing a difference between the estimated value and the load current detected by the current detection unit.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWING(S)

DESCRIPTION OF EMBODIMENT(S)

As described previously, class B operation is intended for power conservation, which is the example of a signal waveform that can be inputted to a class B amplifier.

Figure 2:
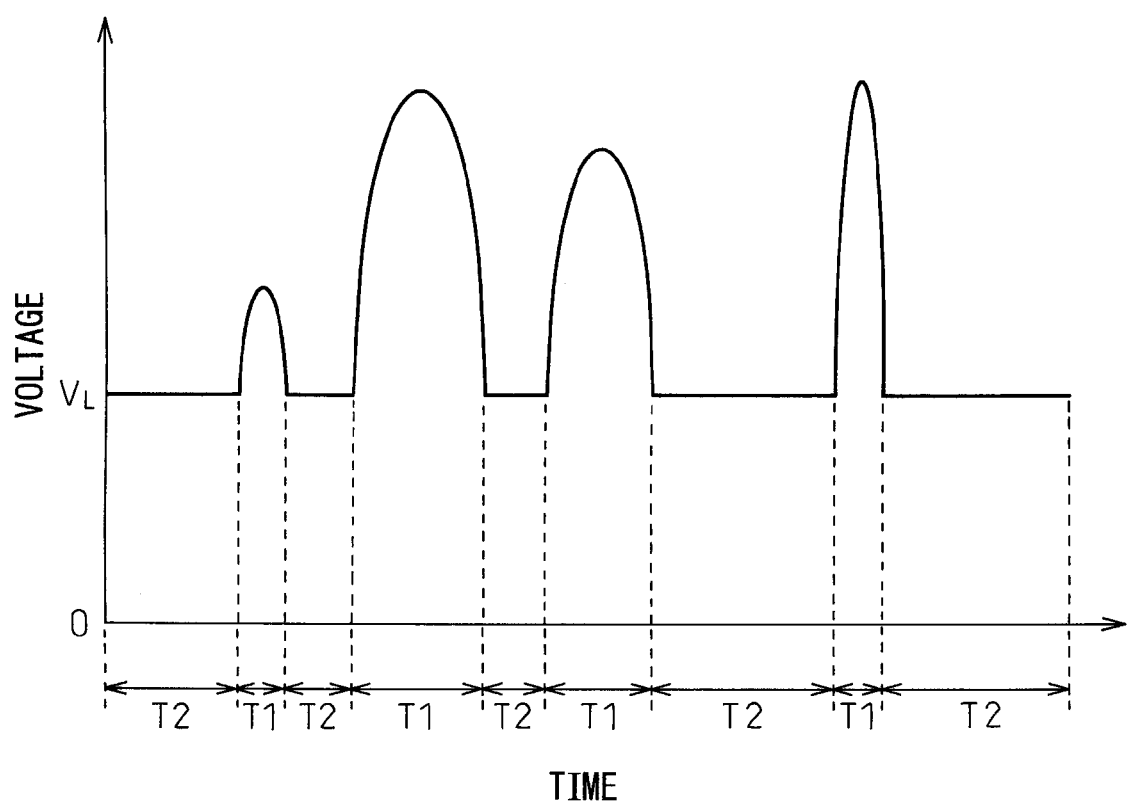
FIG. 2 is an explanatory diagram illustrating the waveform of a first example of an input signal.

FIG. 2 is an explanatory diagram illustrating the waveform of a first example of the input signal. The input signal waveform alternates repeatedly between a first section T1 where there is a waveform to be amplified and a second section T2 where there is not. In the first section T1, the signal value varies within a range limited by a lower limit value $V_L$. For example, in the input signal example illustrated in FIG. 2, the waveform has a shape similar to that of a half-wave and, during the second section T2, the signal remains unchanged with its signal value maintained substantially at the lower limit value $V_L$.

When amplifying the waveform having the above-described characteristic, since there is no signal waveform to be amplified in the second section T2, there is no need to amplify the portions of the waveform that lie in regions below the lower limit value $V_L$. Therefore, amplifier power consumption can be reduced by using a class B amplifier.

Figure 1:
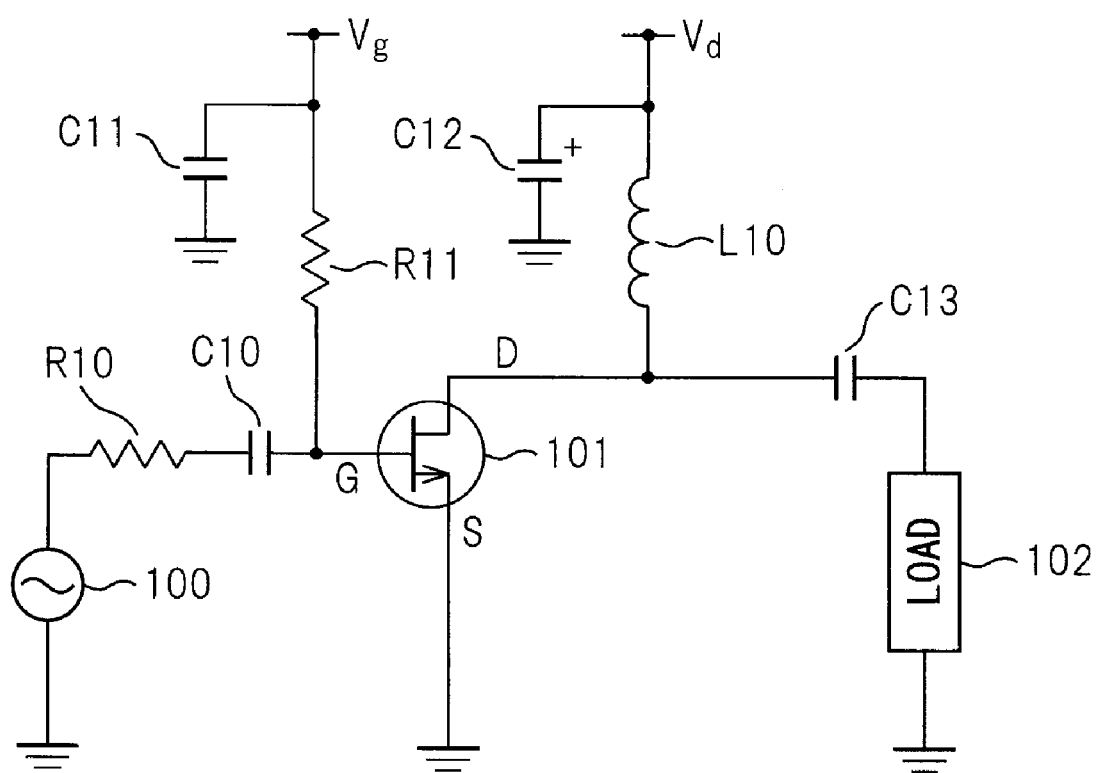
FIG. 1 is an explanatory diagram illustrating a configuration example of an amplifying circuit.
Figure 3:
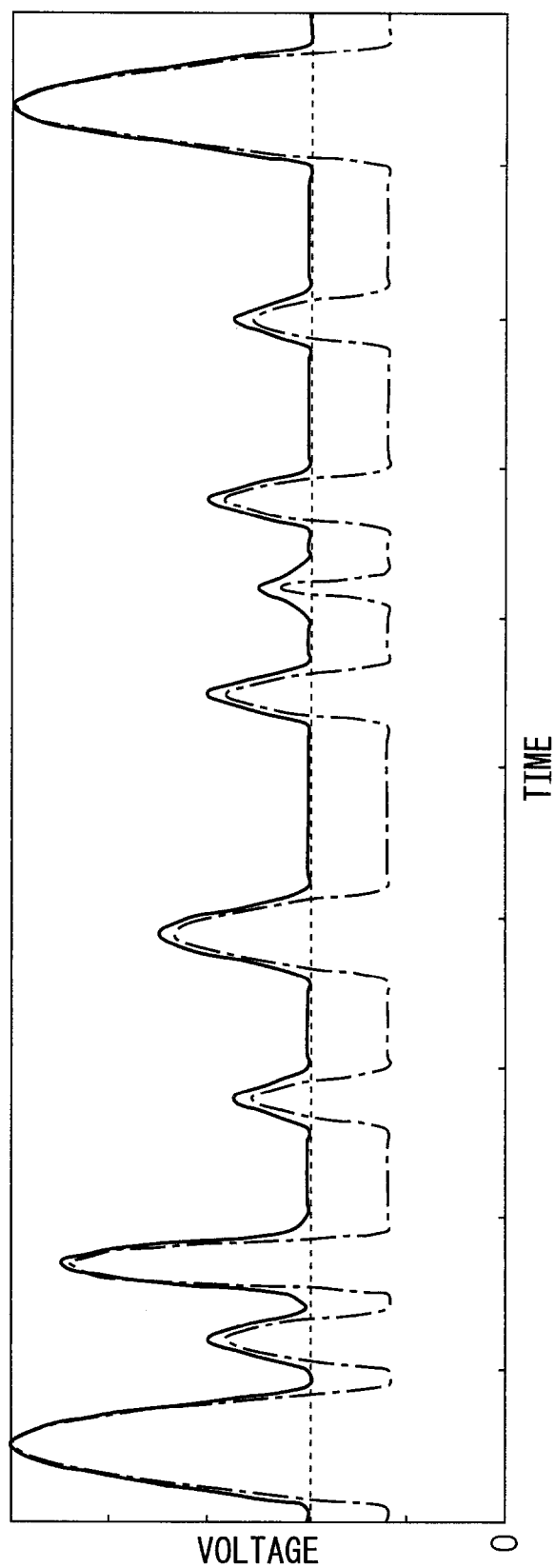
FIG. 3 is an explanatory diagram illustrating the shape of an output waveform produced by the amplifying circuit depicted in FIG. 1.

Next, referring to FIG. 3, a description will be given of the shape of the output waveform produced when the waveform having the characteristic described above with reference to FIG. 2 is amplified by the amplifying circuit of FIG. 1 which is operated in class B. The semi-dashed line indicates the input signal waveform having the above-described characteristic. The dashed line indicates the DC level of the input signal. The solid line indicates the waveform of the signal output from the drain terminal of the FET 101, the waveform here being inverted for ease of comparison.

When the gate bias voltage is added to the input signal passed through the DC component removing capacitor C10, the DC level of the input signal indicated by the dashed line becomes equal to the gate bias voltage. When the amplifying circuit is used as a class B amplifying circuit, since the gate bias voltage is set at or near the pinch-off voltage, the portions of the waveform that lie in regions where the voltage level is lower than the gate bias voltage are not amplified.

When the signal having the characteristic described above with reference to FIG. 2 is input to the class B amplifying circuit, the DC level of the input signal becomes larger than the lower limit value $V_L$. For example, in the case of the waveform illustrated in FIG. 2, the signal value in the second section T2 is approximately equal to the lower limit value $V_L$, but the DC level of the input signal is larger than the lower limit value $V_L$. As a result, if the input signal is supplied to the class B amplifier after removing the DC component of the signal, the output waveform will have a shape such that the input waveform is sliced at the DC level. If a bipolar transistor is used instead of the FET 101, the output waveform will also have a shape such that the input waveform is sliced at the cutoff voltage.

Further, in the case of a class B amplifying circuit using an FET, for example, the bias voltage is set at or near the pinch-off voltage, and in the case of a class B amplifying circuit using a bipolar transistor, for example, the bias voltage is set at or near the cutoff voltage. If these bias voltages are not set appropriately, either the reproducibility of the amplified waveform worsens or power consumption increases.

Therefore, in a class B amplifier, if the DC component of the input signal is removed, the output waveform may have a shape such that the input waveform is sliced at the DC level, and this can impair the reproducibility of the waveform. To address this, a method was considered that superimposes the bias voltage directly on the input signal, rather than removing the DC component at the input. For example, in the case of an amplifying circuit that uses an FET as an amplifying device as illustrated in FIG. 1, the gate bias voltage is superimposed directly on the input signal, after which the input signal is applied to the gate of the FET without passing it through the DC component removing capacitor C10.

In this case also, if the gate bias voltage is too low, the output waveform will have a shape such that the input waveform is sliced. Conversely, if the gate bias voltage is too high, the drain current will flow excessively, increasing the power consumption. In view of this, the class B amplifying circuit according to the embodiment described herein is provided with a bias determining unit that determines the input bias.

Figure 4:
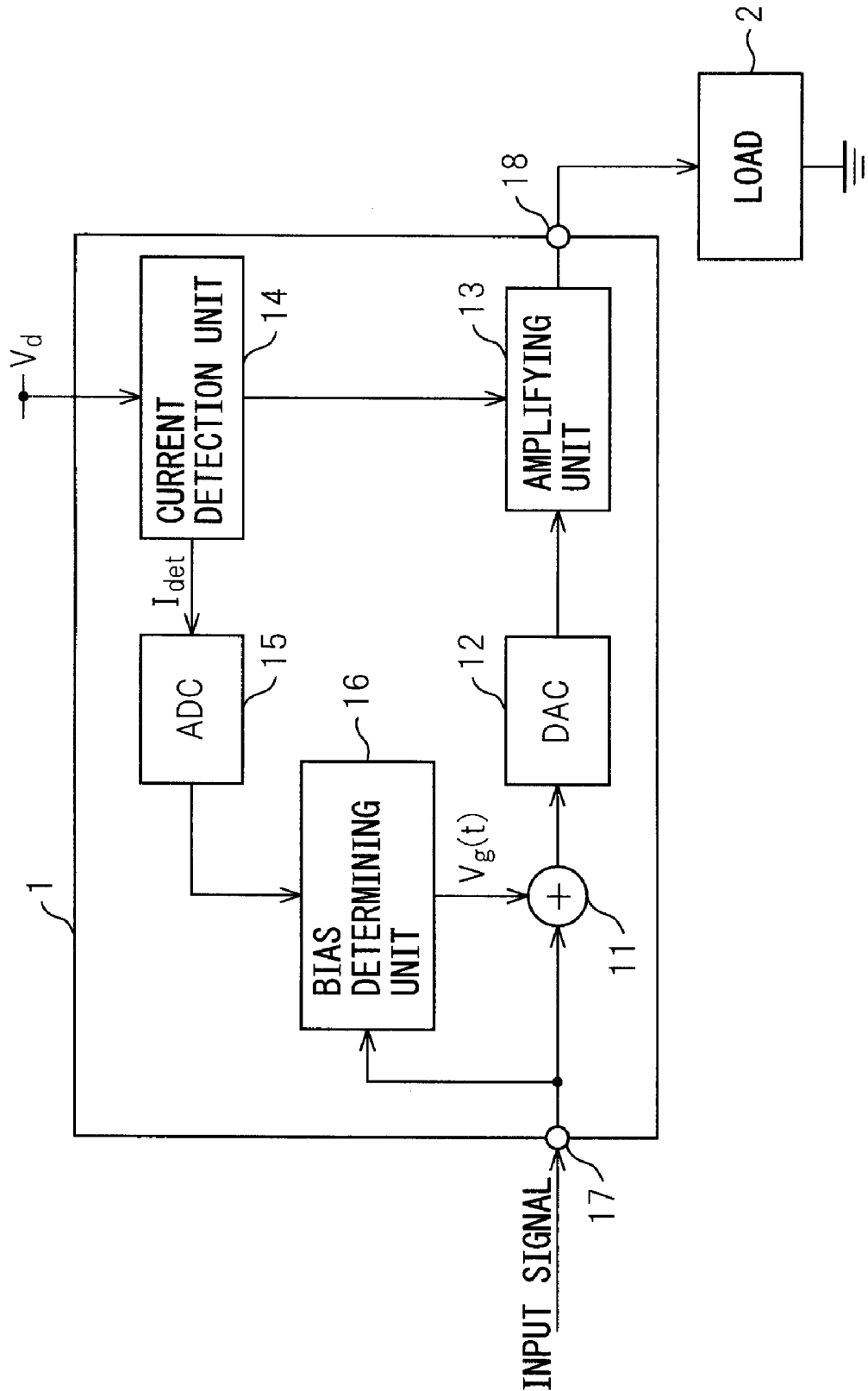
FIG. 4 is an explanatory diagram illustrating a configuration example of an amplifying circuit according to the present disclosure.

The embodiment will be described below with reference to the accompanying drawings. FIG. 4 is an explanatory diagram illustrating a configuration example of the amplifying circuit according to the present disclosure. Reference numeral 1 represents the amplifying circuit, and reference numeral 2 indicates a load; further, reference numeral 11 indicates an adder, and 12 indicates a digital-analog converter (DAC). Reference numeral 13 indicates an amplifying unit, 14 indicates a current detection unit, and 15 indicates an analog-digital converter (ADC); the bias determining unit is indicated at 16. Reference numeral 17 indicates an input line via which the input signal is applied to the amplifying circuit 1, and 18 indicates an output line via which an amplified signal produced by amplifying the input signal is output from the amplifying circuit 1 to the load 2.

In the amplifying circuit 1, the input signal supplied in digital form is first converted into an analog signal which is then amplified by a predetermined voltage gain A, and the amplified signal produced by thus amplifying the input signal is applied to the load 2. The signal having the characteristic earlier described with reference to FIG. 2 is input to the amplifying circuit 1, and the amplifying circuit 1 is used to amplify such an input signal.

The adder 11, the DAC 12, the amplifying unit 13, the current detection unit 14, the ADC 15, and the bias determining unit 16 together constitute the amplifying circuit 1. The adder 11 adds a bias voltage $V_g(t)$ to the input signal and supplies the resulting signal to the DAC 12. The bias voltage $V_g(t)$ is determined by the bias determining unit 16 at every predetermined interval of time. Time t indicates the determination timing at which the bias voltage $V_g(t)$ is determined.

$V_g(t)$ represents the input bias voltage of the amplifying unit 13 that is determined at a given determination timing t. As will be described later, when the amplifying unit 13 uses an FET as the amplifying device, $V_g(t)$ may be the gate bias voltage of the FET.

The DAC 12 converts the sum of the input signal and the bias voltage $V_g(t)$ into an analog signal which is then supplied to the amplifying unit 13. The amplifying unit 13 amplifies the input signal by the predetermined voltage gain A and applies the resulting amplified signal to the load 2.

The current detection unit 14 detects a load current $I_{det}$ that flows from a power supply line into the load 2 under the control of the amplifying unit 13. When the amplifying unit 13 uses an FET as the amplifying device, as described below, the current $I_{det}$ may be the drain current of the FET. Further, rather than an instantaneous value of the load current $I_{det}$, the current detection unit 14 may output its average value as the detection result. The ADC 15 converts the load current $I_{det}$ into a digital signal.

The bias determining unit 16 determines the bias voltage $V_g(t)$ based on the input signal and the load current $I_{det}$.

Figure 5:
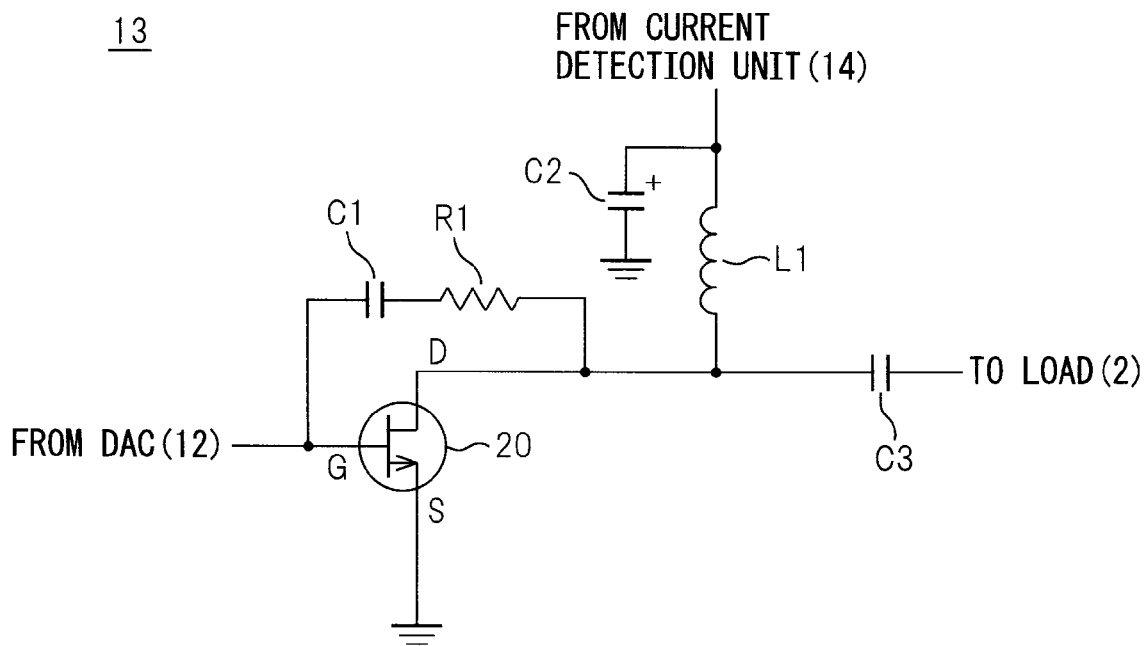
FIG. 5 is an explanatory diagram illustrating a first configuration example of an amplifying unit.

FIG. 5 is an explanatory diagram illustrating a first configuration example of the amplifying unit 13. Reference numeral 20 indicates an n-channel FET, R1 indicates a resistor, C1, C2, and C3 indicate capacitors, and L1 indicates an inductor. The amplifying unit 13 includes a source grounding circuit for the FET 20 which is used as the amplifying device. The output signal from the DAC 12 is applied to the gate terminal of the FET 20, and the drain terminal of the FET 20 is coupled via the inductor L1 and the current detection unit 14 to the power supply line that supplies voltage $V_d$. This power supply line is grounded via the capacitor C2.

The drain and gate terminals of the FET 20 is connected together by a feedback line having a series connection of the resistor R1 and the capacitor C1. The voltage gain of the FET 20 is controlled to the predetermined value A through this feedback line. The FET 20 amplifies the output signal of the DAC 12 by the predetermined voltage gain A, and supplies the resulting amplified signal to the load 20 via the DC component removing capacitor C3.

Figure 6:
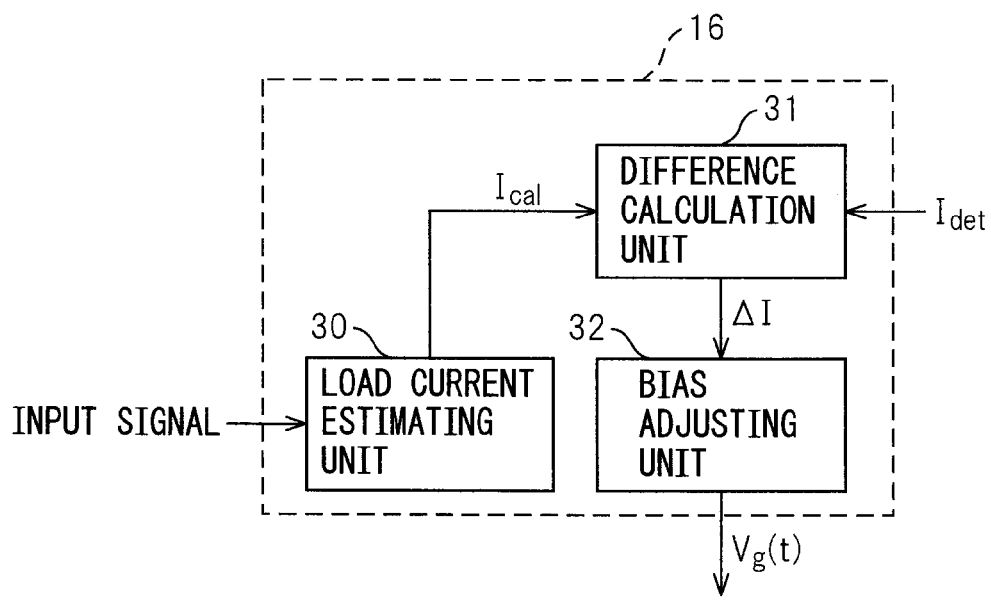
FIG. 6 is an explanatory diagram illustrating a configuration example of a bias determining unit.

FIG. 6 is an explanatory diagram illustrating a configuration example of the bias determining unit 16. Reference numeral 30 indicates a load current estimating unit, 31 indicates a difference calculation unit, and 32 indicates a bias adjusting unit. The load current estimating unit 30, the difference calculation unit 31, and the bias adjusting unit 32 together constitute the bias determining unit 16.

All or some of the constituent elements 30 to 32 of the bias determining unit 16 may be implemented on a dedicated hardware circuit. The bias determining unit 16 may include a processor and a storage device for storing an operating program for the processor. All or some of the functions of the constituent elements 30 to 32 may be implemented by the processor executing the operating program. The bias determining unit 16 may include a programmable LSI such as an FPGA. The FPGA may be configured to implement all or some of the functions of the constituent elements 30 to 32.

The load current estimating unit 30 calculates an estimated value $I_{cal}$ of the load current $I_{det}$ based on the voltage level of the input signal. The load current estimating unit 30 calculates the estimated value $I_{cal}$, for example, by the following method.

Figure 7:
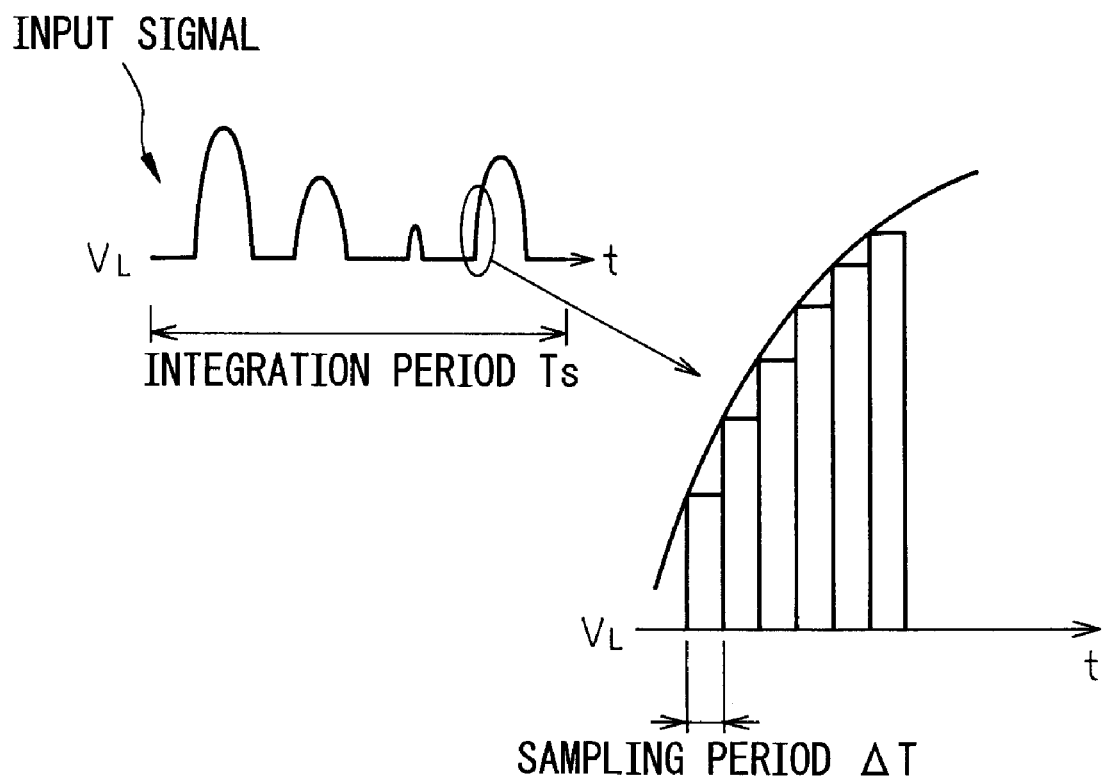
FIG. 7 is an explanatory diagram illustrating how an average input voltage is calculated.

First, the load current estimating unit 30 calculates an average input voltage $S_p$ which represents the average potential difference between the input signal and the lower limit value $V_L$ of the signal in the first section T1. FIG. 7 is an explanatory diagram illustrating how the load current estimating unit 30 calculates the average input voltage $S_p$. The load current estimating unit 30 divides the measurement time of the input signal voltage on the basis of a predetermined integration period $T_s$. The load current estimating unit 30 calculates the average input voltage $S_p$ in accordance with the following equation (1); i.e., an integrated value calculated by integrating over each integration period $T_s$ the difference $(V_{in}-V_L)$ between the input voltage $V_{in}$ and the lower limit value $V_L$ of the signal in the first section T1 of FIG. 2 is divided by the integration period $T_s$.

$$S_p = \frac{\sum_{T_s}\{(V_{in} - V_L) \times \Delta T\}}{T_s} \quad (1)$$

In equation (1), $\Delta T$ denotes the sampling period of the input signal. Next, the load current estimating unit 30 calculates the estimated value $I_{cal}$ in accordance with the following equation (2).

$$I_{cal} = (S_p \times A)/ZL \quad (2)$$

In equation (2), constant A is the voltage gain of the amplifying unit 13, and constant ZL is the resistance of the load 2.

Reference is made to FIG. 6. The difference calculation unit 31 calculates a difference $\Delta I$ in accordance with the following equation (3) by subtracting the load current $I_{det}$ detected by the current detection unit 14 from the estimated value $I_{cal}$ calculated by the load current estimating unit 30.

$$\Delta I = I_{cal} - I_{det} \quad (3)$$

Alternatively, the difference calculation unit 31 may calculate the difference $\Delta I$ in accordance with the following equation (4) by adding a predetermined adjusting constant to the value obtained by subtracting the load current $I_{det}$ from the estimated value $I_{cal}$.

$$\Delta I = I_{cal} - I_{det} + B \quad (4)$$

Figure 8A:
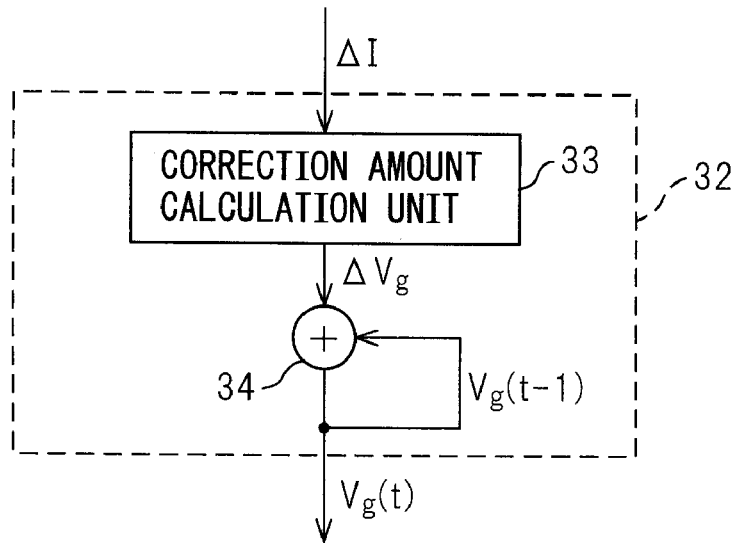
FIGS. 8A and 8B are explanatory diagrams illustrating first and second configuration examples, respectively, of a bias adjusting unit.

The bias adjusting unit 32 adjusts the bias voltage $V_g(t)$ (i.e., the gate bias voltage of the FET 20) in such a manner as to reduce the difference $\Delta I$. FIG. 8A is an explanatory diagram illustrating a first configuration example of the bias adjusting unit 32. Reference numeral 33 indicates a correction amount calculation unit, and 34 indicates an adder. The correction amount calculation unit 33 and the adder 34 together constitute the bias adjusting unit 32.

Based on the difference $\Delta I$, the correction amount calculation unit 33 calculates a bias correction amount $\Delta V_g$, i.e., the amount by which to correct the bias voltage $V_g(t)$. The adder 34 corrects the bias voltage $V_g(t)$ by adding the bias correction amount $\Delta V_g$ to the bias voltage $V_g(t-1)$ determined at the immediately preceding determination timing (t−1).

Figure 9A:
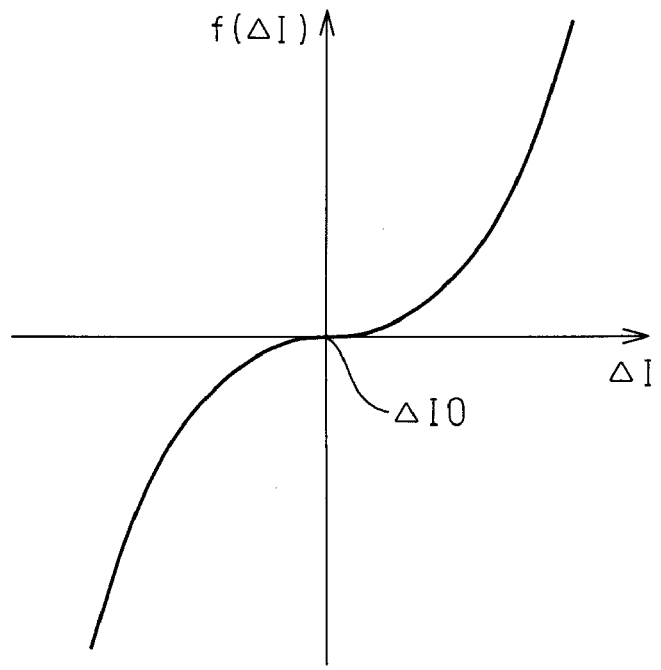
FIGS. 9A and 9B are explanatory diagrams each illustrating a function $f(\Delta I)$ that is used to determine a bias correction amount $\Delta V_g$.
Figure 9B:
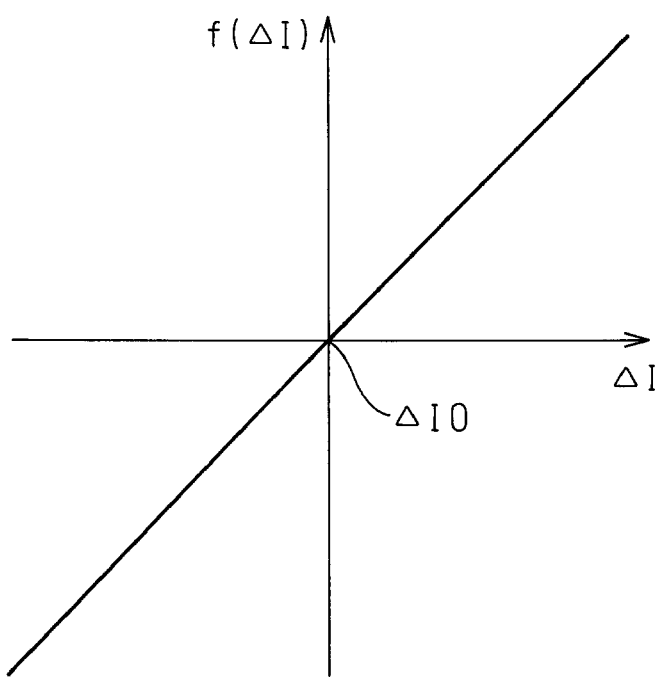

FIGS. 9A and 9B are explanatory diagrams each illustrating a function $f(\Delta I)$ that is used to determine the bias correction amount $\Delta V_g$. The correction amount calculation unit 33 calculates the bias correction amount $\Delta V_g$ by using the function $f(\Delta I)$ whose independent variable is the difference $\Delta I$, as given by the following equation (5).

$$\Delta V_g = f(\Delta I) \quad (5)$$

The function $f(\Delta I)$ is a monotonically increasing function having a function value "0" for a given difference $\Delta I0$. When the difference $\Delta I$ is relatively large, i.e., when the actual detected value $I_{det}$ (i.e., the load current) is smaller than the value $I_{cal}$ estimated from the input signal, the sign of $\Delta V_g$ is positive. As a result, the bias voltage $V_g(t)$ is increased, thus increasing the load current. Since the actual detected value $I_{det}$ thus increases, the difference between the estimated value $I_{cal}$ and the actual detected value $I_{det}$ reduces.

Conversely, when the difference $\Delta I$ is relatively small, i.e., when the actual detected value $I_{det}$ is larger than the value $I_{cal}$ estimated from the input signal (the load current is excessive), the sign of $\Delta V_g$ is negative. As a result, the bias voltage $V_g(t)$ is reduced, thus reducing the load current. Since the actual detected value $I_{det}$ thus reduces, the difference between the estimated value $I_{cal}$ and the actually detected value $I_{det}$ reduces.

The function f(ΔI) may be a function whose slope changes as its value departs from the given difference ΔI0, as depicted in FIG. 9A. For example, the function f(ΔI) may be a function whose slope increases as its value departs from the given difference ΔI0. Alternatively, the function f(ΔI) may be a function whose value is proportional to ΔI, as depicted in FIG. 9B.

Figure 8B:
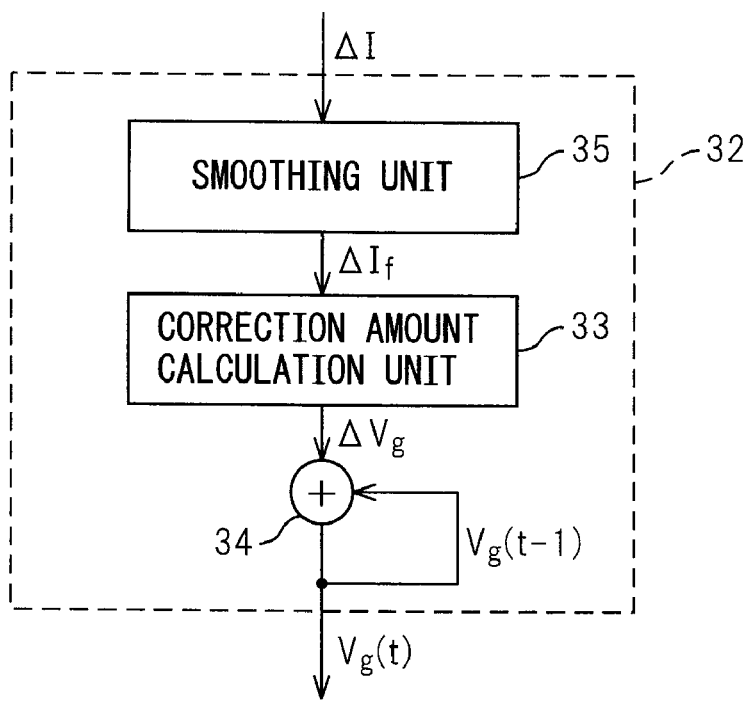

FIG. 8B is an explanatory diagram illustrating a second configuration example of the bias adjusting unit 32. Reference numeral 35 indicates a smoothing unit. The correction amount calculation unit 33, the adder 34, and the smoothing unit 35 together constitute the bias adjusting unit 32.

The smoothing unit 35 smoothes the variation of the difference ΔI. The smoothing unit 35 outputs difference $\Delta I_f$ by smoothing the variation of the difference ΔI. The smoothing unit 35 may be configured to smooth the variation of the difference ΔI by calculating the moving average value of the difference ΔI and taking it as the difference $\Delta I_f$. For example, the smoothing unit 35 may be implemented as an accumulator that stores the difference ΔI calculated in each of the past (n+1) integration periods as ΔI(i) (i is an integer between 0 and n) and that calculates the smoothed difference $\Delta I_f$ in accordance with the following equation (6).

$$\Delta I_f = \frac{\sum_{i=0}^{n} \Delta I(i)}{n} \quad (6)$$

The correction amount calculation unit 33 calculates the bias correction amount $\Delta V_g$ based on the smoothed difference $\Delta I_f$ in much the same way that it calculates the bias correction amount $\Delta V_g$ based on the difference ΔI in the configuration of FIG. 8A. The adder 34 corrects the bias voltage $V_g(t)$ by adding the bias correction amount $\Delta V_g$ to the bias voltage $V_g(t-1)$ determined at the immediately preceding determination timing (t−1).

According to the configuration example of FIG. 8B, the speed with which the bias voltage $V_g(t)$ responds to the change of the difference ΔI can be adjusted by adjusting the degree of the smoothing to be applied by the smoothing unit 35. For example, when calculating the bias correction amount $\Delta V_g$ based on the moving average value of the difference ΔI as in the above equation (6), the time constant with which the bias voltage $V_g(t)$ responds to the change of the difference ΔI can be adjusted by adjusting the integration period Ts and the averaging interval n.

Figure 10:
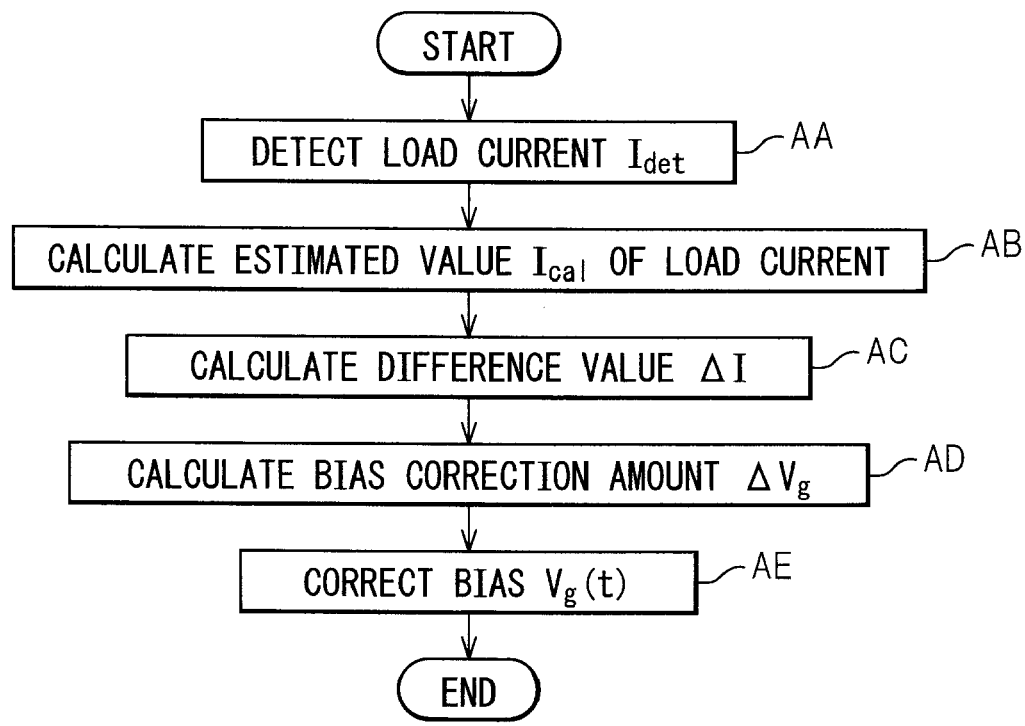
FIG. 10 is an explanatory diagram illustrating a bias adjusting method according to the present disclosure.

FIG. 10 is an explanatory diagram illustrating a bias adjusting method according to the present disclosure. In an alternative embodiment, the following operations AA to AE may be implemented as steps. In operation AA, the current detection unit 14 detects the load current $I_{det}$ that flows from the power supply line into the load 2 under the control of the amplifying unit 13. Rather than an instantaneous value of the load current $I_{det}$, the current detection unit 14 may output its average value as the detection result.

In operation AB, the load current estimating unit 30 calculates the estimated value $I_{cal}$ of the load current $I_{det}$ based on the voltage level of the input signal.

In operation AC, the difference calculation unit 31 calculates the difference ΔI by subtracting the detected current $I_{det}$ from the estimated value $I_{cal}$ in accordance with the earlier given equation (3) or (4).

In operation AD, the correction amount calculation unit 33 calculates the bias correction amount $\Delta V_g$ based on the difference ΔI in accordance with the earlier given equation (5).

Alternatively, the correction amount calculation unit 33 may calculate the bias correction amount $\Delta V_g$ based on the smoothed difference $\Delta I_f$ output from the smoothing unit 35.

In operation AE, the adder 34 corrects the bias voltage $V_g(t)$ by adding the bias correction amount $\Delta V_g$ to the bias voltage $V_g(t-1)$ determined at the immediately preceding determination timing (t−1).

The bias voltage $V_g(t)$ is then fed to the adder 11 where it is superimposed as the gate bias voltage of the FET 20 onto the input signal. The input signal with the bias voltage $V_g(t)$ superimposed thereon is input directly to the amplifying unit 13 without passing through the DC component removing capacitor; in this way, the bias voltage $V_g(t)$ is adjusted so that the actual load current value $I_{det}$ becomes equal to the load current estimated value $I_{cal}$ calculated from the input signal waveform.

In this condition, it can be considered that the actual measured value $I_{det}$ is identical to the load current estimated value $I_{cal}$ predicted based on the input signal waveform. That is, in this condition, it is considered that the input signal waveform in the first section T1 is correctly reproduced in the output signal waveform, and that no excessive current is flowing. Accordingly, by adjusting the bias in accordance with the above method, the amplifying unit 13 is biased with the correct bias voltage $V_g(t)$.

Figure 11:
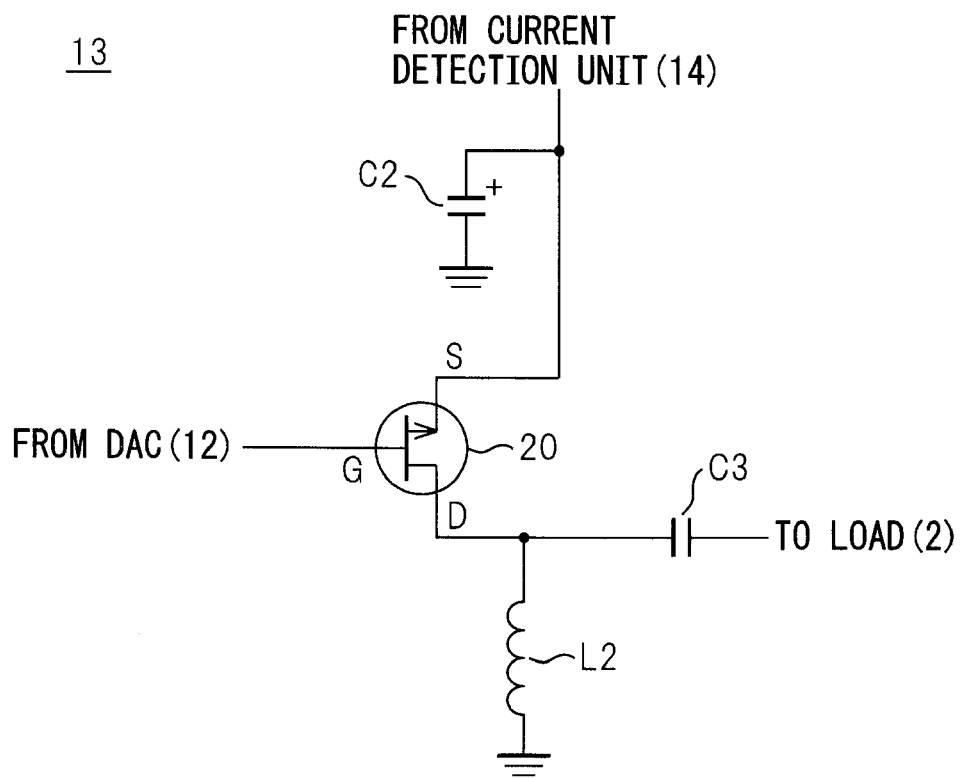
FIG. 11 is an explanatory diagram illustrating a second configuration example of the amplifying unit.

In the above configuration example, the amplifying unit 13 includes a source grounding circuit for the FET 20 which is used as the amplifying device. Alternatively, the amplifying unit 13 may include a drain grounding circuit for the FET 20. FIG. 11 is an explanatory diagram illustrating a second configuration example of the amplifying unit 13. Reference numeral 20 indicates an n-channel FET, C2 and C3 indicate capacitors, and L2 indicates an inductor.

The output signal from the DAC 12 is applied to the gate terminal of the FET 20, and the source terminal of the FET 20 is coupled via the current detection unit 14 to a power supply line that supplies voltage $V_d$. This power supply line is grounded via the capacitor C2. The drain terminal of the FET 20 is grounded via the inductor L2, and the output signal from the drain terminal is supplied to the load 2 via the DC component removing capacitor C3.

The above description has been given by taking as an example the amplifying circuit that uses an FET as the amplifying device. It will, however, be appreciated that the device and method disclosed herein can be applied extensively to any class B amplifying circuit. Therefore, the scope of the device and method disclosed herein is not limited to amplifying circuits that use FETs. The scope of the device and method disclosed herein includes any class B amplifying circuit whose bias is adjusted in accordance with the above configuration and method. For example, a bipolar transistor may be used as the amplifying device.

According to the present embodiment, since the bias voltage is correctly adjusted, the reproducibility of the waveform produced by amplifying the input signal having the characteristic previously described with reference to FIG. 2 improves. Furthermore, according to the present embodiment, since the bias voltage is correctly adjusted so that no excessive drain current flows, the power utilization efficiency of the amplifying circuit improves.

In the present embodiment, the bias determining unit 16 determines the bias voltage $V_g(t)$ in a manner relatively unaffected by the kind, magnitude, and shape of the input waveform. That is, since the estimated value $I_{cal}$ and the measured value $I_{det}$ both change simultaneously and in a similar manner with the input signal, the bias voltage $V_g(t)$ calculated based on their difference (estimated value $I_{cal}$–measured value $I_{det}$) is relatively unaffected by the behavior of the input waveform.

Accordingly, the method of the embodiment can be used regardless of the shape of the input signal waveform such as the density of the input signal waveform (the change with time of the duty ratio which is the ratio between the first section T1 and the second section T2). Further, the method of the embodiment can be used regardless of the shape of the input signal waveform such as the presence or absence of a flat portion where the input signal value is maintained at its lower limit value $V_L$. Furthermore, since there is no need for the bias determining unit 16 to respond so as to follow the change of the input signal waveform, the bias determining unit 16 can be implemented without using a high-speed circuit.

As described above, the bias voltage $V_g(t)$ is relatively unaffected by the behavior of the input waveform. However, in such cases as when the density of the input signal waveform changes, that is, when the duty ratio, i.e., the ratio between the first section T1 and the second section T2, changes with time, the load current changes between a period where the duty ratio is large and a period where the duty ratio is small. As a result, the difference $\Delta I$ can change between a large-duty-ratio period and a small-duty-ratio period. The difference $\Delta I$ can also change due to such factors as changes in temperature. By providing the smoothing unit 35, the speed with which the bias voltage $V_g(t)$ responds to the change of the difference $\Delta I$ can be adjusted, thus reducing the perturbations of the bias voltage $V_g(t)$ caused by the change with time of the duty ratio. For example, by adjusting the integration period Ts and the averaging interval n, as earlier described, the time constant with which the bias voltage $V_g(t)$ responds to the change of the difference $\Delta I$ can be adjusted.

Figure 12:
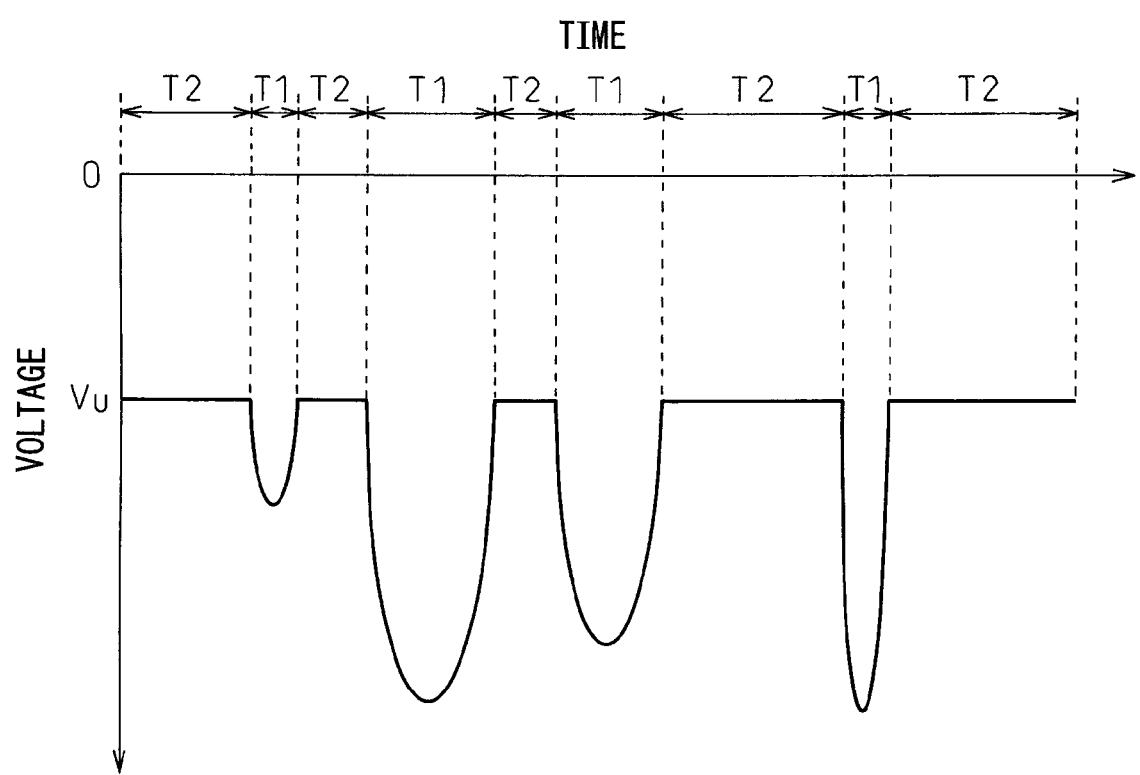
FIG. 12 is an explanatory diagram illustrating the waveform of a second example of the input signal.

FIG. 12 is an explanatory diagram illustrating the waveform of a second example of the input signal. The input signal waveform alternates repeatedly between a first section T1 where there is a waveform to be amplified and a second section T2 where there is not. In the first section T1, the signal value varies within a range limited by an upper limit value $V_u$. In the input signal example illustrated here, the waveform has a shape similar to that of a half-wave and, during the second section T2, the signal remains unchanged with its signal value maintained substantially at the upper limit value $V_u$.

The amplifying circuit 1 depicted in FIG. 4 may be used to amplify the input signal illustrated in FIG. 12. In this case, the load current estimating unit 30 calculates the average input voltage $S_p$ by dividing an integrated value, calculated by integrating over each integration period $T_s$ the difference $(V_{in}-V_u)$ between the input voltage $V_{in}$ and the upper limit value $V_u$, by the integration period $T_s$.

Figure 13:
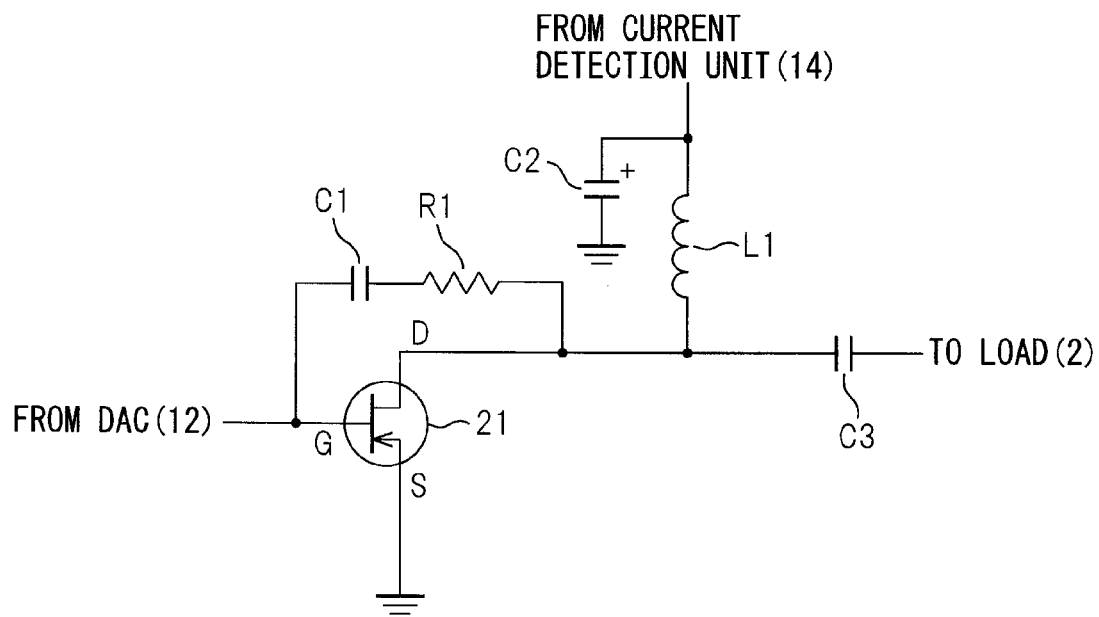
FIG. 13 is an explanatory diagram illustrating a third configuration example of the amplifying unit.

To amplify the waveform in the first section T1 illustrated in FIG. 12, the amplifying unit 13 is configured as illustrated in FIG. 13. Reference numeral 21 indicates a p-channel FET, R1 indicates a resistor, C1, C2, and C3 indicate capacitors, and L1 indicates an inductor. The amplifying unit 13 includes a source grounding circuit for the FET 21 which is used as the amplifying device. The output signal from the DAC 12 is applied to the gate terminal of the FET 21, and the drain terminal of the FET 21 is coupled via the inductor L1 and the current detection unit 14 to a power supply line that supplies a voltage of negative polarity. This power supply line is grounded via the capacitor C2.

The drain and gate terminals of the FET 21 is connected together by a feedback line having a series connection of the resistor R1 and the capacitor C1. The voltage gain of the FET 21 is controlled to the predetermined value A through this feedback line. The FET 21 amplifies the output signal of the DAC 12 by the predetermined voltage gain A, and supplies the resulting amplified signal to the load 20 via the DC component removing capacitor C3.

Figure 14:
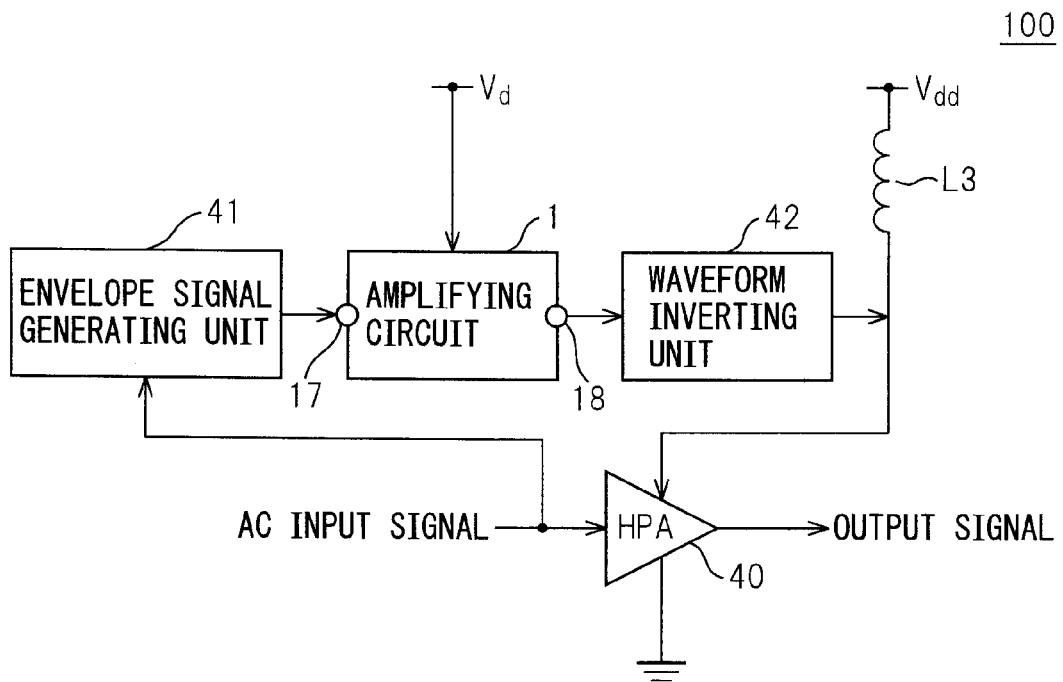
FIG. 14 is an explanatory diagram illustrating a configuration example of an AC signal amplifying circuit according to the present disclosure.

FIG. 14 is an explanatory diagram illustrating a configuration example of an AC signal amplifying circuit 100 according to the present disclosure. The AC signal amplifying circuit 100 is a circuit for amplifying an AC input signal which is an AC signal in the microwave region. Reference numeral 1 indicates the amplifying circuit described with reference to FIG. 4, 40 indicates a high-power amplifier (HPA), 41 indicates an envelope signal generating unit, 42 indicates a waveform inverting unit, and L3 indicates an inductor. When the amplifying unit 13 in the amplifying circuit 1 is constructed as illustrated in FIG. 11, the waveform inverting unit 42 need not be provided.

The amplifying circuit 1, the HPA 40, the envelope signal generating unit 41, the waveform inverting unit 42, and the inductor L3 together constitute the AC signal amplifying circuit 100. The HPA 40 is an amplifying device for amplifying the AC input signal in the microwave region. The envelope signal generating unit 41 generates an envelope signal that has an envelope waveform corresponding to the AC input signal supplied to the HPA 40. The envelope signal generating unit 41 supplies the generated envelope signal to the amplifying circuit 1 described with reference to FIG. 4. The envelope signal is, for example, a signal in the VHF band.

The amplifying circuit 1 amplifies the envelope signal and supplies the amplified signal to the waveform inverting unit 42. The waveform inverting unit 42 outputs a relatively small signal for a relatively large input and a relatively large signal for a relatively small input, thus generating an inverted signal by inverting the waveform of the amplified envelope signal with respect to the magnitude of the signal intensity. The inverted signal output from the waveform inverting unit 42 is added to the supply voltage $V_{dd}$ that is being supplied from the power supply line via the inductor L3. The supply voltage with the inverted signal added thereto is supplied as power to the HPA 40.

With the above configuration, the HPA 40 is supplied with a large supply voltage during a period when the amplitude of the envelope of the AC input signal is large and with a small supply voltage during a period when the amplitude of the envelope of the AC input signal is small; this serves to reduce the power consumption of the HPA 40.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations can be made hereto without departing from the spirit and scope of the invention.

What is claimed is:

1. An amplifying circuit for amplifying an input signal having a waveform that alternates repeatedly between a first section where a signal value varies within a variation range limited by at least one of upper and lower limit values and a second section that is a section other than the first section, comprising:

an amplifying unit which amplifies the input signal and applies amplified signal to a designated load;

a current detection unit which detects a load current that flows into the designated load upon application of the amplified signal;

an estimating unit which calculates, based on a voltage level of the input signal, an estimated value of the load current to be supplied to the load; and an adjusting unit which adjusts an input bias, to be applied to the amplifying unit, in such a manner as to reduce a difference value representing a difference between the estimated value and the load current detected by the current detection unit.

2. The amplifying circuit as claimed in claim 1, wherein the estimating unit calculates a time-averaged value of the estimated value, based on a time-averaged value of the difference between the voltage level and the limit value and on a resistance value of the designated load and a gain of the amplifying unit, and the adjusting unit adjusts the input bias in such a manner as to reduce a difference value representing the difference between the time-averaged value of the estimated value and the time-averaged value of the load current detected by the current detection unit.

3. The amplifying circuit as claimed in claim 1, wherein the adjusting unit comprises a smoothing unit which smoothes any variation in the input bias that varies under control of the adjusting unit.

4. The amplifying circuit as claimed in claim 1, wherein the amplifying unit is operated in class B to amplify the input signal.

5. The amplifying circuit as claimed in claim 1, wherein the amplifying unit is a field-effect transistor, the input signal is applied to a gate terminal of the field-effect transistor, the current detecting unit detects a drain current of the field-effect transistor, and the adjusting unit adjusts a gate voltage of the field-effect transistor.

6. An AC signal amplifying circuit comprising:
an amplifier which amplifies an AC signal;
an envelope signal generating unit which generates an envelope signal of the AC signal and supplies the envelope signal as the input signal to the amplifying circuit, wherein the envelope signal having a waveform that alternates repeatedly between a first section where a signal value varies within a variation range limited by at least one of upper and lower limit values and a second section that is a section other than the first section;

an amplifying unit which amplifies the envelope signal and applies amplified signal to a load on the amplifying unit;

a current detection unit which detects a load current that flows into the load upon application of the amplified signal;

an estimating unit which calculates, based on a voltage level of the envelope signal, an estimated value of the load current to be supplied to the load;

an adjusting unit which adjusts an input bias, to be applied to the amplifying unit, in such a manner as to reduce a difference value representing a difference between the estimated value and the load current detected by the current detection unit; and a supply voltage adjusting unit which adjusts a supply voltage for the amplifier in accordance with the amplified signal outputted from the amplifying unit.

7. An input bias adjusting method for adjusting an input bias to be applied to an amplifying unit which amplifies an input signal having a waveform that alternates repeatedly between a first section where a signal value varies within a variation range limited by at least one of upper and lower limit values and a second section that is a section other than the first section, and which applies an amplified signal to a designated load, the method comprising:

detecting a load current that flows into the designated load upon application of the amplified signal;

calculating, based on a voltage level of the input signal, an estimated value of the load current to be supplied to the load; and adjusting the input bias to be applied to the amplifying unit, in such a manner so as to reduce a difference value representing a difference between the estimated value and the detected load current.

8. The input bias adjusting method as claimed in claim 7, wherein the amplifying unit is operated in class B to amplify the input signal.

* * * * *